(12) United States Patent
Pellizzer et al.

(10) Patent No.: US 11,587,979 B2
(45) Date of Patent: Feb. 21, 2023

(54) THREE DIMENSIONAL MEMORY ARRAY

(71) Applicant: Micron Technology, Inc., Boise, ID (US)

(72) Inventors: Fabio Pellizzer, Boise, ID (US); Innocenzo Tortorelli, Cernusco sul Naviglio (IT); Agostino Pirovano, Milan (IT); Andrea Redaelli, Casatenovo (IT)

(73) Assignee: Micron Technology, Inc., Boise, ID (US)

( * ) Notice: Subject to any disclaimer, the term of this patent is extended or adjusted under 35 U.S.C. 154(b) by 42 days.

(21) Appl. No.: 17/144,669

(22) Filed: Jan. 8, 2021

(65) Prior Publication Data

US 2021/0134885 A1  May 6, 2021

Related U.S. Application Data

(63) Continuation of application No. 16/513,797, filed on Jul. 17, 2019, now Pat. No. 10,896,932, which is a
(Continued)

(51) Int. Cl.
*H01L 27/24* (2006.01)
*H01L 45/00* (2006.01)
*G11C 13/00* (2006.01)

(52) U.S. Cl.
CPC .......... *H01L 27/249* (2013.01); *G11C 13/003* (2013.01); *G11C 13/004* (2013.01);
(Continued)

(58) Field of Classification Search
CPC ............... H01L 27/249; H01L 27/0688; H01L 45/1233; H01L 45/141; H01L 45/1608;
(Continued)

(56) References Cited

U.S. PATENT DOCUMENTS 8,507,353 B2  8/2013 Oh et al.
8,729,523 B2  5/2014 Pio
(Continued)

FOREIGN PATENT DOCUMENTS

CN  104718625 A  6/2015
CN  105097818 A  11/2015
(Continued)

OTHER PUBLICATIONS

Decision of Rejection from related Japanese Patent Application No. 2019-554501, dated Apr. 27, 2021, 17 pages.
(Continued)

*Primary Examiner* — Tu-Tu V Ho
(74) *Attorney, Agent, or Firm* — Brooks, Cameron & Huebsch, PLLC

(57) ABSTRACT

The present disclosure includes three dimensional memory arrays, and methods of processing the same. A number of embodiments include a plurality of conductive lines separated from one other by an insulation material, a plurality of conductive extensions arranged to extend substantially perpendicular to the plurality of conductive lines, and a storage element material formed around each respective one of the plurality of conductive extensions and having two different contacts with each respective one of the plurality of conductive lines, wherein the two different contacts with each respective one of the plurality of conductive lines are at two different ends of that respective conductive line.

17 Claims, 15 Drawing Sheets

Related U.S. Application Data continuation of application No. 16/118,632, filed on Aug. 31, 2018, now Pat. No. 10,497,753, which is a continuation of application No. 15/482,016, filed on Apr. 7, 2017, now Pat. No. 10,096,655.

(52) U.S. Cl.
CPC ...... *G11C 13/0023* (2013.01); *G11C 13/0069* (2013.01); *H01L 45/1233* (2013.01); *H01L 45/141* (2013.01); *H01L 45/1608* (2013.01); *G11C 2213/71* (2013.01); *G11C 2213/77* (2013.01)

(58) Field of Classification Search
CPC ............ H01L 21/8221; G11C 13/0023; G11C 13/003; G11C 13/004; G11C 13/0069; G11C 2213/71; G11C 2213/77
USPC ............................................................ 257/5
See application file for complete search history.

(56) References Cited

U.S. PATENT DOCUMENTS

| | | | |
|---|---|---|---|
| 8,803,118 | B2 | 8/2014 | Redaelli et al. |
| 8,822,971 | B2 | 9/2014 | Park et al. |
| 8,841,649 | B2 | 9/2014 | Pio |
| 8,847,186 | B2 | 9/2014 | Redaelli et al. |
| 9,166,158 | B2 | 10/2015 | Lengade et al. |
| 9,842,651 | B2 * | 12/2017 | Harari ............... H01L 29/40117 |
| 9,978,810 | B2 | 5/2018 | Pellizzer |
| 10,418,418 | B2 | 9/2019 | Murakami |
| 2010/0308296 | A1 | 12/2010 | Pirovano et al. |
| 2011/0272663 | A1 | 11/2011 | An et al. |
| 2013/0200326 | A1 | 8/2013 | Ju et al. |
| 2014/0061575 | A1 | 3/2014 | Pio |
| 2014/0217349 | A1 | 8/2014 | Hopkins |
| 2014/0326939 | A1 | 11/2014 | Yamato et al. |
| 2015/0263074 | A1 | 9/2015 | Takaki |
| 2015/0340369 | A1 | 11/2015 | Lue |
| 2016/0225825 | A1 | 8/2016 | Hwang et al. |
| 2017/0125097 | A1 | 5/2017 | Tortorelli et al. |
| 2017/0148517 | A1 | 5/2017 | Harari |

FOREIGN PATENT DOCUMENTS

| | | |
|---|---|---|
| JP | 2011-139057 A | 7/2011 |
| JP | 2013-115436 A | 6/2013 |
| JP | 2015-228484 A | 12/2015 |
| JP | 2015-534720 A | 12/2015 |
| JP | 2018157020 A | 10/2018 |
| WO | 2016043657 A1 | 3/2016 |
| WO | 2016053453 A1 | 4/2016 |

OTHER PUBLICATIONS

International Search Report and Written Opinion from related International patent application No. PCT/US2018/021948, dated Jun. 25, 2018, 16 pp.
Notice for Reasons of Rejection from related Korean Application No. 10-2019-7029935, dated Aug. 31, 2020, 10 pages.
Notice of Rejection from related Japan Application No. 2019-554501, dated Oct. 13, 2020, 19 pages.
European Search Report from related European Patent Application No. 18781677.2, dated Dec. 2, 2020, 6 pages.
Notice of Rejection Ground from related Japanese Patent Application No. 2019-554501, dated Jan. 25, 2022, 15 pages.
Pre-Appeal Reexamination Report from related Japanese Patent Application No. 2019-554501, dated Aug. 24, 2021, 12 pages.

* cited by examiner

THREE DIMENSIONAL MEMORY ARRAY

PRIORITY INFORMATION

This application is a Continuation of U.S. application Ser. No. 16/513,797, filed on Jul. 17, 2019, which is a Continuation of U.S. application Ser. No. 16,118,632, filed Aug. 31, 2018, now issued as U.S. Pat. No. 10,497,753 on Dec. 3, 2019, which is a Continuation of U.S. application Ser. No. 15/482,016, filed Apr. 7, 2017, now issued as U.S. Pat. No. 10,096,655 on Oct. 9, 2018, the specifications of which are incorporated herein by reference.

TECHNICAL FIELD

The present disclosure relates generally to semiconductor memory and methods, and more particularly, to three dimensional memory arrays.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistive memory cells that can store data based on the resistance state of a storage element (e.g., a resistive memory element having a variable resistance). As such, resistive memory cells can be programmed to store data corresponding to a target data state by varying the resistance level of the resistive memory element. Resistive memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the resistive memory element of the cells) for a particular duration. A state of a resistive memory cell can be determined by sensing current through the cell responsive to an applied interrogation voltage. The sensed current, which varies based on the resistance level of the cell, can indicate the state of the cell.

One of a number of data states (e.g., resistance states) can be set for a resistive memory cell. For example, a single level memory cell (SLC) can be programmed to a targeted one of two different data states, which can be represented by the binary units 1 or 0 and can depend on whether the cell is programmed to a resistance above or below a particular level. As an additional example, some resistive memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

DETAILED DESCRIPTION

Figure 1A:
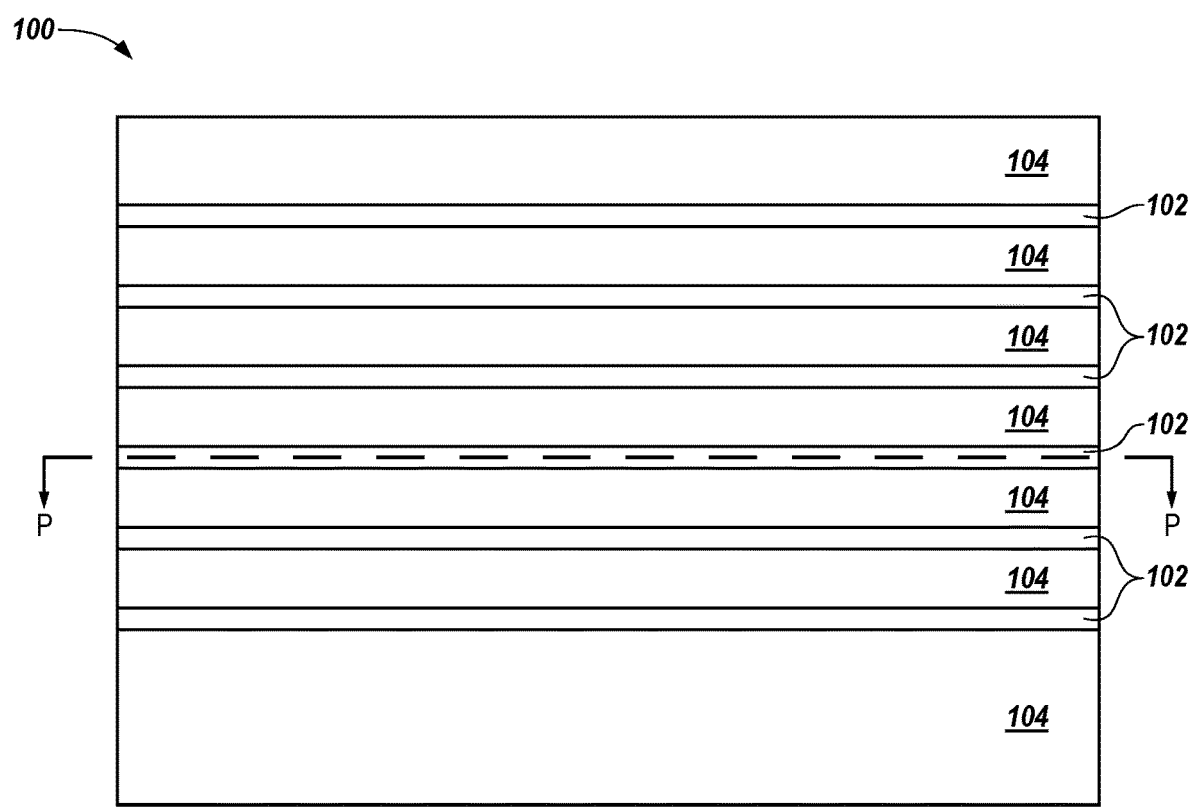
FIGS. 1A-1B illustrate various views of a processing step associated with forming a three dimensional memory array in accordance with an embodiment of the present disclosure.

The present disclosure includes three dimensional memory arrays, and methods of processing the same. A number of embodiments include a plurality of conductive lines separated from one other by an insulation material, a plurality of conductive extensions arranged to extend substantially perpendicular to the plurality of conductive lines, and a storage element material formed around each respective one of the plurality of conductive extensions and having two different contacts with each respective one of the plurality of conductive lines, wherein the two different contacts with each respective one of the plurality of conductive lines are at two different ends of that respective conductive line.

The memory cells of a three dimensional memory array in accordance with the present disclosure may have a reduced contact area between the storage element of the cell and the conductive line (e.g., electrode plane) of the cell as compared with memory cells of previous three dimensional memory arrays. For example, the contact area between the storage element and conductive line of memory cells of a three dimensional memory array in accordance with the present disclosure may be reduced by a factor of three as compared with the contact area between the storage element and conductive line of the memory cells of previous three dimensional memory arrays. In some examples, the contact area may be reduced by a factor of four, or more.

The reduction of the contact area of the memory cells of a three dimensional memory array in accordance with the present disclosure can increase the performance of the three dimensional memory array (e.g., the performance of a memory device that includes the array) as compared with the performance of previous three dimensional memory arrays. For example, the reduction of the contact area can reduce the programming current used to program the cells to their target data state as compared with the programming current used to program the cells of previous three dimensional memory arrays. As an additional example, the reduction of the contact area can improve the voltage threshold window of the storage element of the cells, which can enhance the sensing window for determining the state of the cells as compared to the cells of previous three dimensional memory arrays.

Further, the density of the memory cells of a three dimensional memory array in accordance with the present disclosure may be greater than the density of the memory cells of previous three dimensional memory arrays. For example, the density of memory cells per conductive line in a three dimensional memory array in accordance with the present disclosure may be up to double that of previous three dimensional memory arrays.

As used herein, "a" or "an" can refer to one or more of something, and "a plurality of" can refer to more than one of such things. For example, a memory cell can refer to one or more memory cells, and a plurality of memory cells can refer to two or more memory cells.

The figures herein follow a numbering convention in which the first digit or digits correspond to the drawing figure number and the remaining digits identify an element or component in the drawing. Similar elements or components between different figures may be identified by the use of similar digits. For example, 102 may reference element "02" in FIG. 1A, and a similar element may be referenced as 202 in FIG. 2A.

Figure 1B:
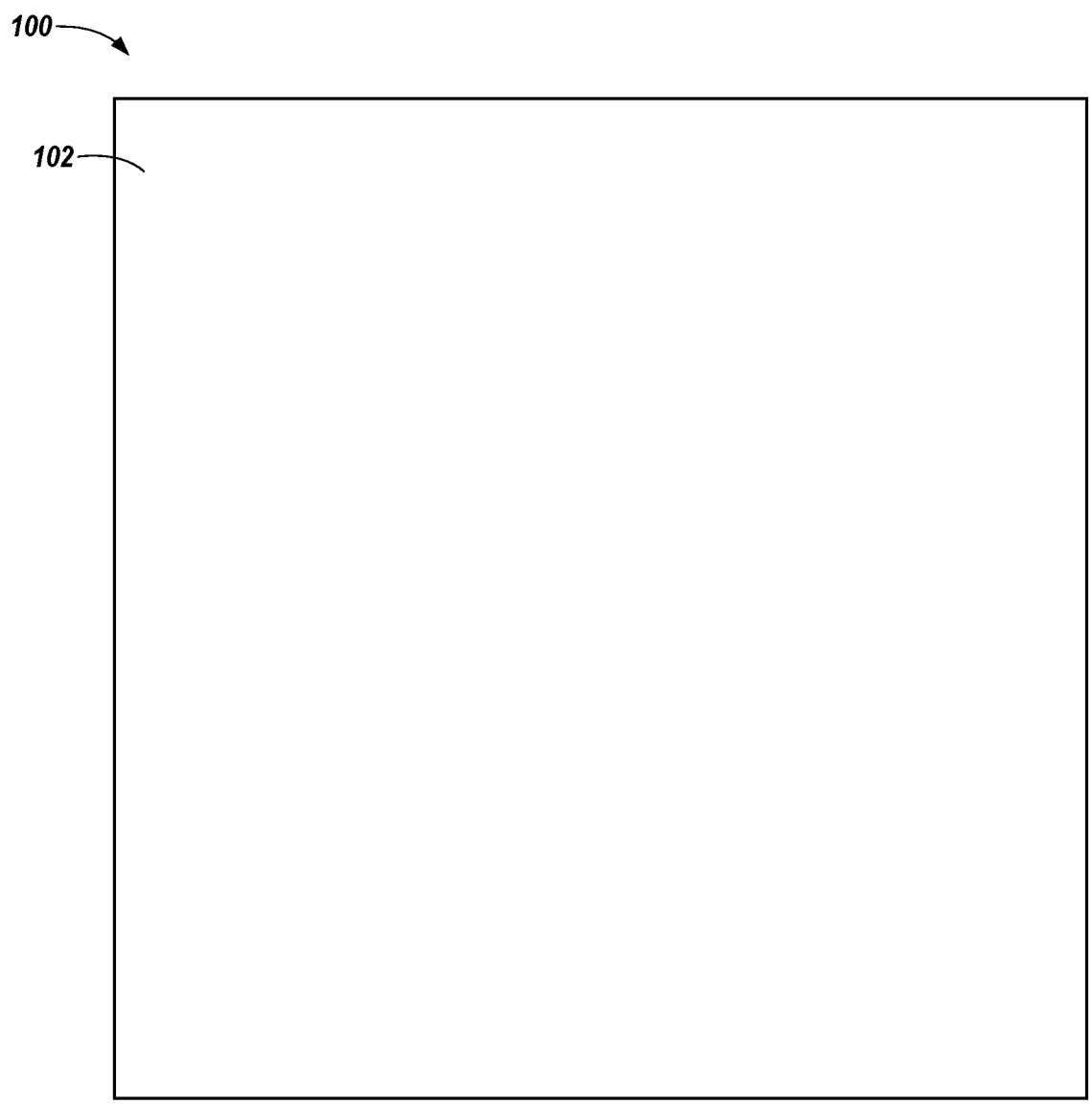

FIGS. 1A-1B illustrate various views of a processing step associated with forming a three dimensional memory array (referred to as 100 in FIGS. 1A-1B) in accordance with an embodiment of the present disclosure. For example, FIG. 1A illustrates a schematic cross-sectional view of the processing step, and FIG. 1B illustrates a top (e.g., plan) view of the processing step along cut line P-P shown in FIG. 1A.

FIGS. 1A-1B show the formation (e.g., deposition) of a conductive line material 102 in a plurality of planes vertically separated from one other by a first insulation material 104. For instance, insulation material 104 can be formed over an etch stop (e.g., substrate) material (not shown in FIGS. 1A-1B), a first conductive line material 102 can then be formed on the insulation material, additional insulation material 104 can then be formed on the first conductive line, a second conductive line material 102 can then be formed on the insulation material that was formed on the first conductive line material, additional insulation material 104 can then be formed on the second conductive line material, and the formation of conductive line material 102 and insulation material 104 can continue in such an alternating manner.

Each respective one of the plurality of planes can be at (e.g., form) a different level of the three dimensional memory array, such as, for instance, a different elevation, deck, or plane (e.g., electrode plane) of the array. For example, each respective conductive line material 102 can be a different access line (e.g., word line) of the array. Conductive line material 102 can comprise (e.g., be formed of) a metallic (or semi-metallic) material or a semiconductor material such as a doped polysilicon material, among others.

Although six levels are shown in the embodiment illustrated in FIGS. 1A-1B, embodiments of the present disclosure are not limited to this quantity. Insulation material 104 can be, for example, a dielectric material, such as, for instance, silicon oxide.

Figure 2A:
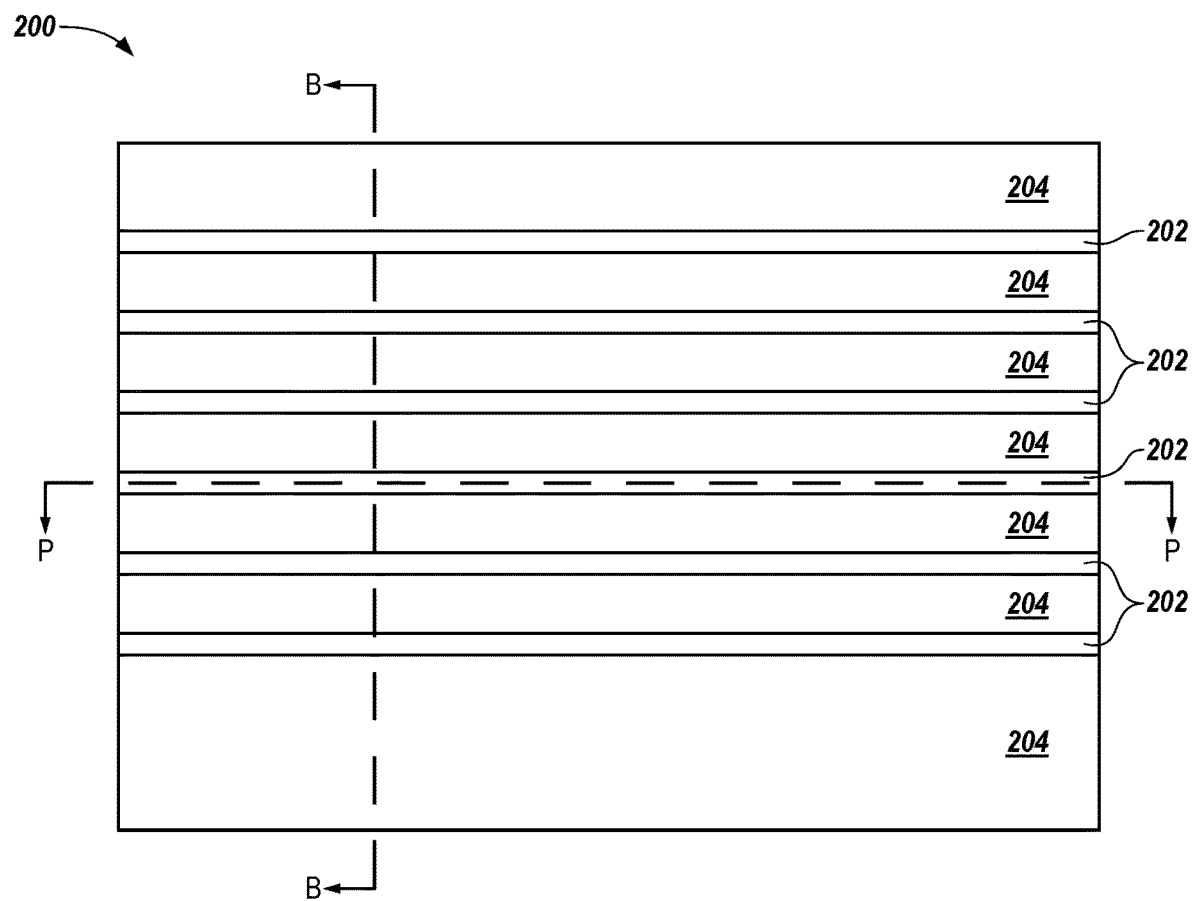
FIGS. 2A-2C illustrate various views of a subsequent processing step associated with forming the three dimensional memory array in accordance with an embodiment of the present disclosure.
Figure 2B:
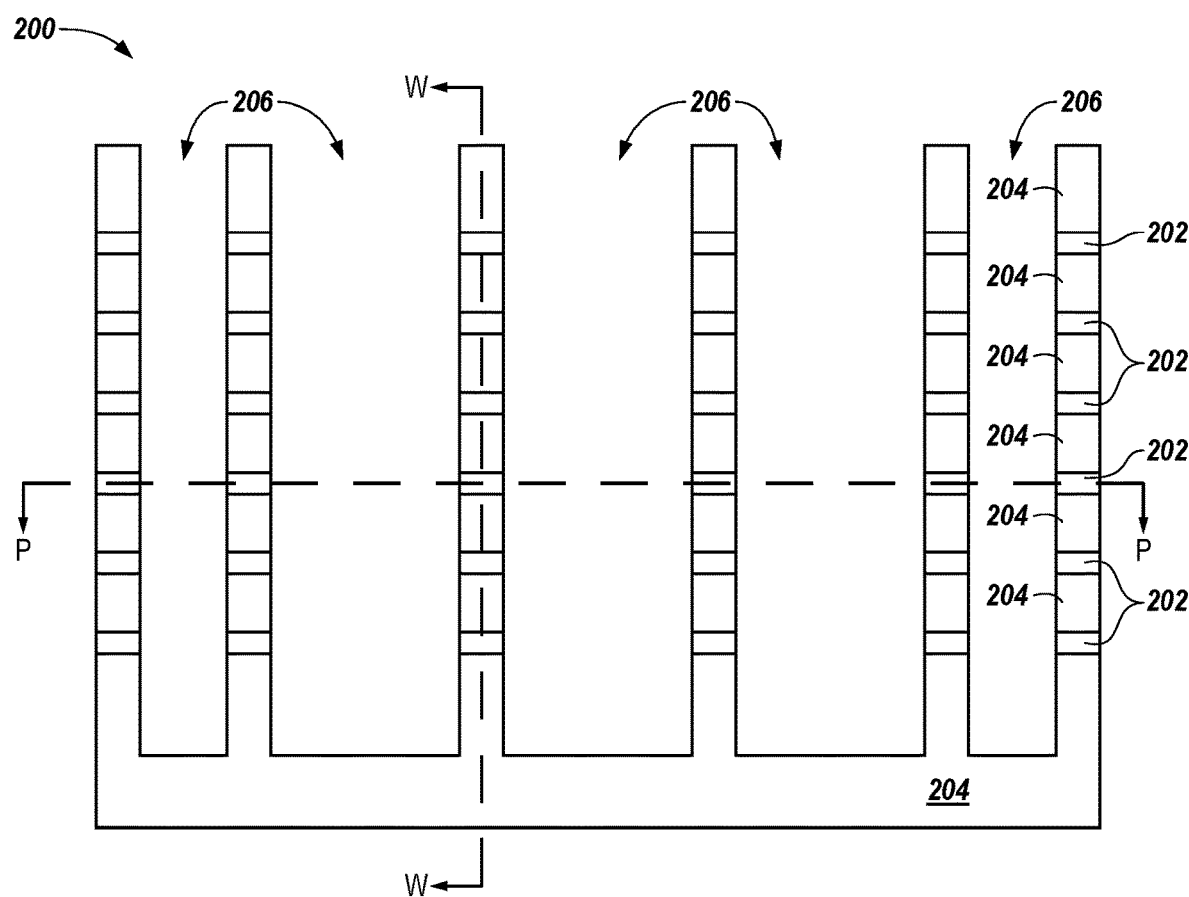
Figure 2C:
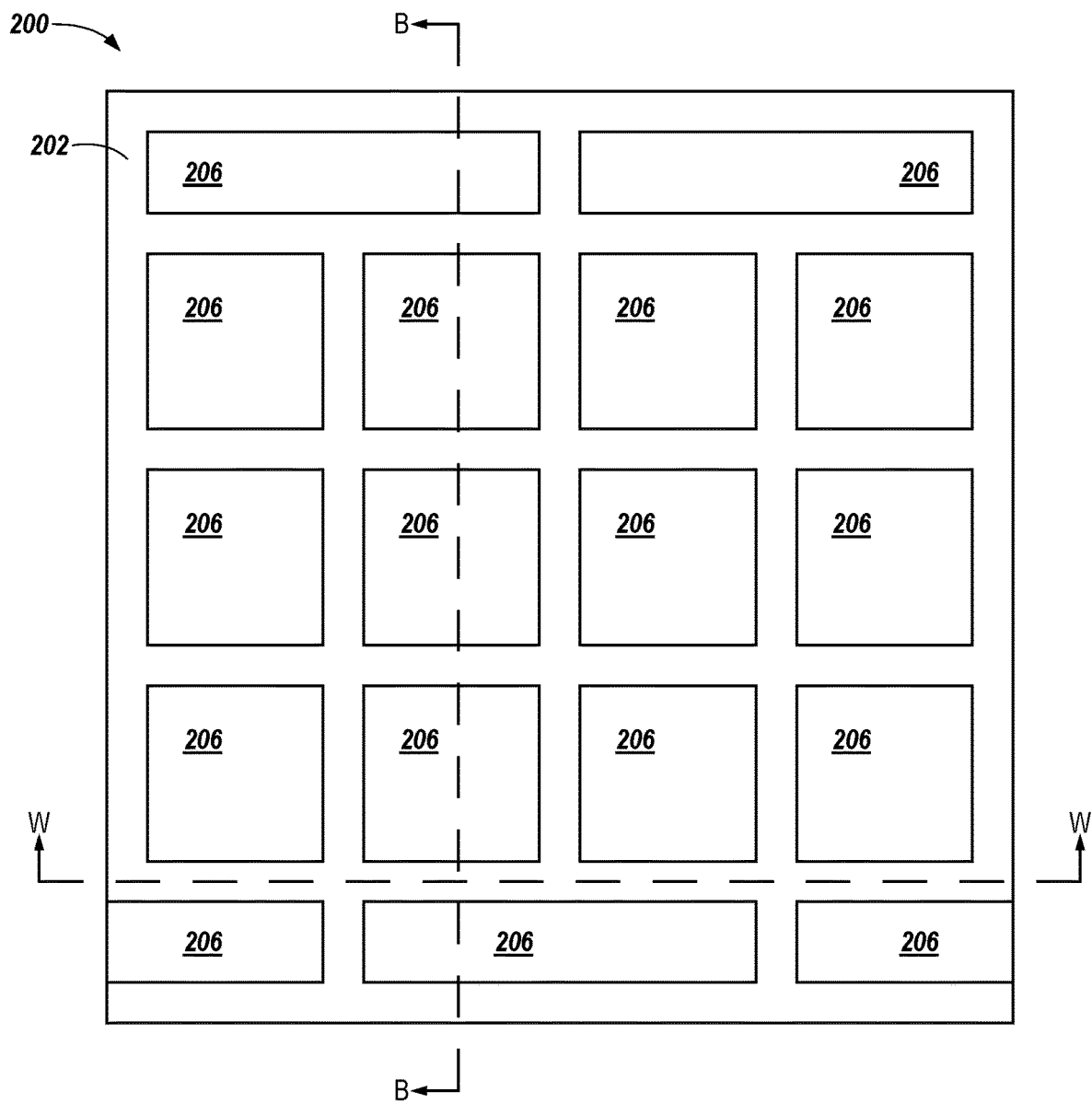

FIGS. 2A-2C illustrate various views of a subsequent processing step associated with forming the three dimensional memory array (referred to as 200 in FIGS. 2A-2C) in accordance with an embodiment of the present disclosure. For example, FIG. 2A illustrates a schematic cross-sectional view, along cut line W-W shown in FIGS. 2B and 2C, of the structure shown in FIGS. 1A-1B after the subsequent processing step. Further, FIG. 2B illustrates a schematic cross-sectional view, along cut line B-B shown in FIGS. 2A and 2C, of the structure shown in FIGS. 1A-1B after the subsequent processing step. Further, FIG. 2C illustrates a top view, along cut line P-P shown in FIGS. 2A and 2B, of the structure shown in FIGS. 1A-1B after the subsequent processing step.

As shown in FIGS. 2A-2C, a plurality of openings (e.g., vias or holes) 206 can be formed (e.g., etched and/or patterned) through the alternating insulation material 204 and conductive line material 202. For example, the plurality of openings 206 can be formed through the conductive line material 202 such that at least a portion of each respective opening 206 passes through each respective conductive line material 202, as illustrated in FIGS. 2A-2C. By forming openings 206, portions of conductive line material 202 can be removed such that the resulting area of conductive line material 202 may exclude the area removed in forming openings 206.

Each of the plurality of openings 206 can be formed at the same time. For instance, each of the plurality of openings 206 can be formed in a single etch and/or pattern using a single mask.

As shown in FIGS. 2A-2C, different ones of openings 206 can be formed in different shapes and/or sizes. For example, in the embodiment illustrated in FIGS. 2A-2C, the openings 206 that are formed adjacent (e.g., along) two opposite sides of array 200 can be rectangular shaped, and the remaining openings 206 formed there between can be square shaped. Forming the plurality of openings 206 is such a manner can allow for each respective conductive line material 202 to be subsequently divided into two different sub-planes (e.g., an even plane and an odd plane), as will be further described herein. As an additional example, openings 206 may be formed such that conductive line material 202 is wider in the B-B direction and narrower in the W-W direction. However, embodiments of the present disclosure are not limited to a particular shape(s) and/or size(s) for openings 206. For example, circular, oval, and/or angled shaped openings, among others, may be formed, with sharp or rounded corners.

Figure 3A:
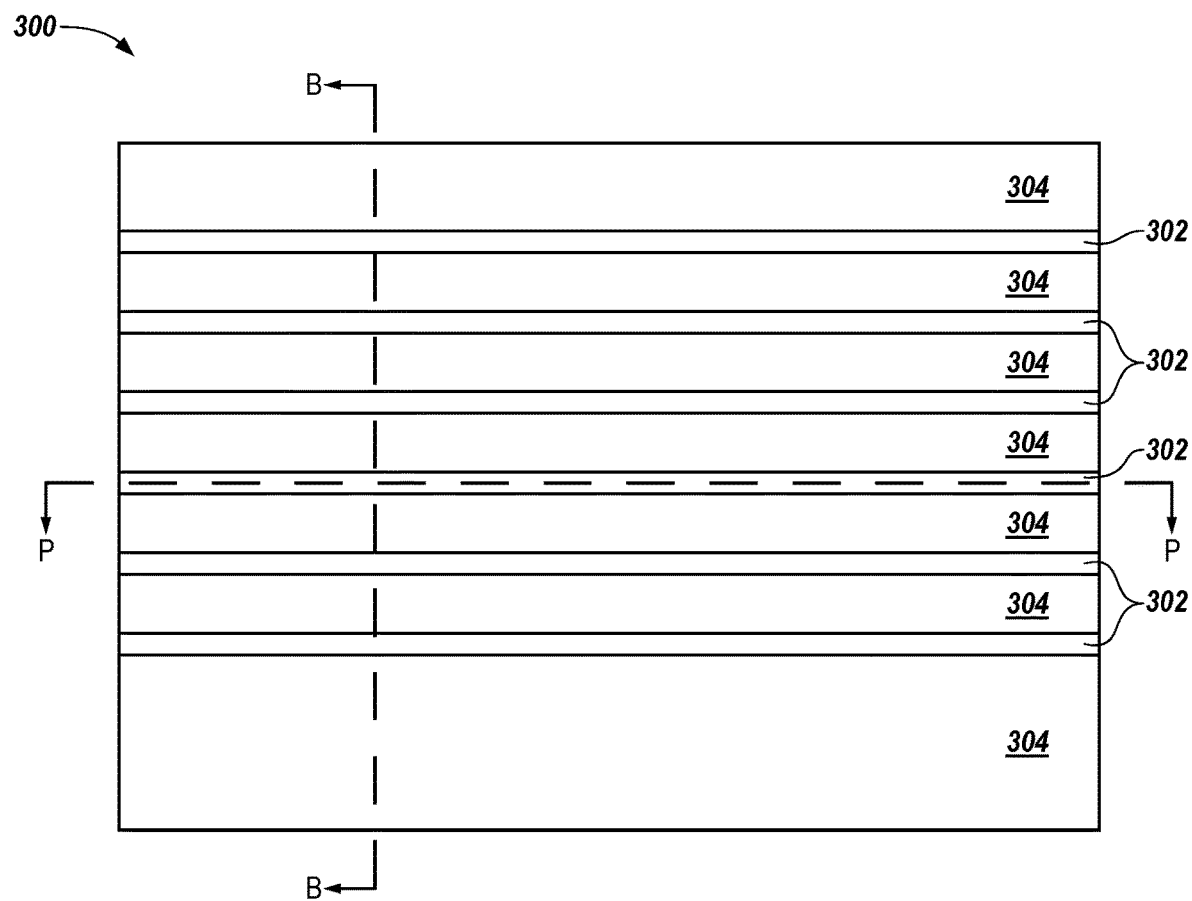
FIGS. 3A-3C illustrate various views of a subsequent processing step associated with forming the three dimensional memory array in accordance with an embodiment of the present disclosure.
Figure 3B:
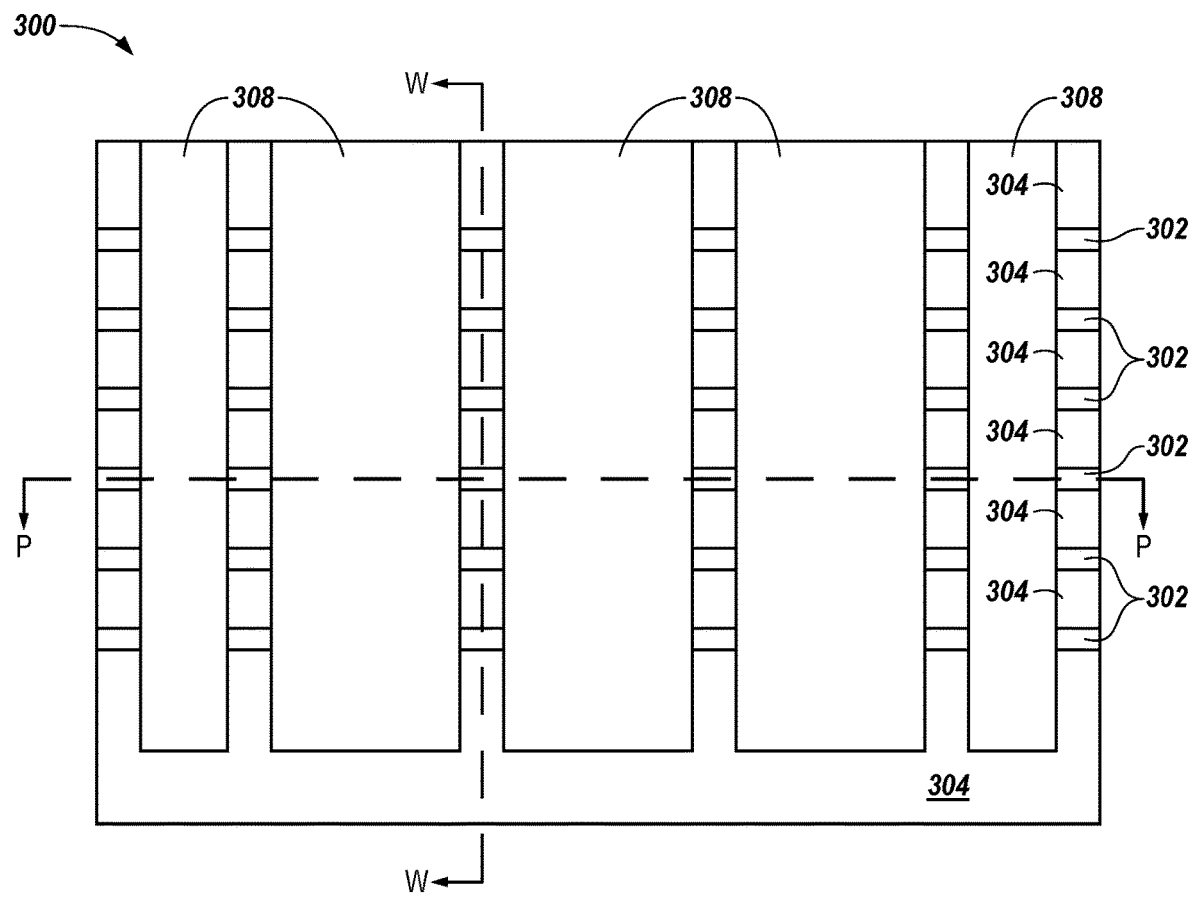
Figure 3C:
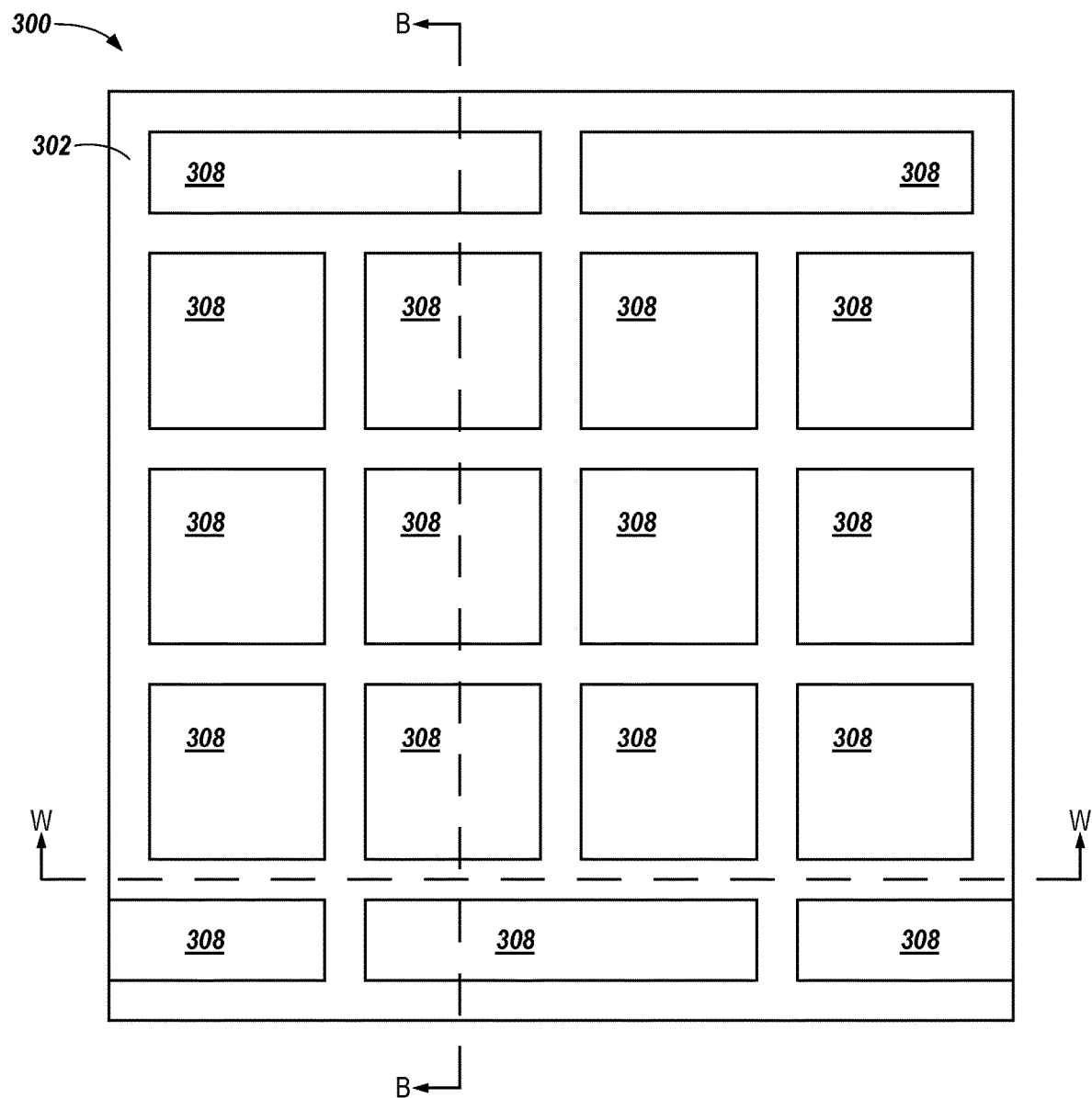

FIGS. 3A-3C illustrate various views of a subsequent processing step associated with forming the three dimensional memory array (referred to as 300 in FIGS. 3A-3C) in accordance with an embodiment of the present disclosure. For example, FIG. 3A illustrates a schematic cross-sectional view, along cut line W-W shown in FIGS. 3B and 3C, of the structure shown in FIGS. 2A-2C after the subsequent processing step. Further, FIG. 3B illustrates a schematic cross-sectional view, along cut line B-B shown in FIGS. 3A and 3C, of the structure shown in FIGS. 2A-2C after the subsequent processing step. Further, FIG. 3C illustrates a top view, along cut line P-P shown in FIGS. 3A and 3B, of the structure shown in FIGS. 2A-2C after the subsequent processing step.

As shown in FIGS. 3A-3C, each of the plurality of openings 206 can be filled by forming (e.g., depositing) an insulation material 308 in each respective opening 206. For instance, each of the plurality of openings 206 can be completely filled with insulation material 308, as illustrated in FIGS. 3A-3C.

Insulation material 308 can be, for example, a dielectric material, such as, for instance, silicon oxide. For instance, insulation material 308 can be the same insulation material as insulation material 304. As an additional example, insulation material 308 can be a different insulation material than insulation material 304. For instance, insulation material 308 can be silicon nitride.

Figure 4A:
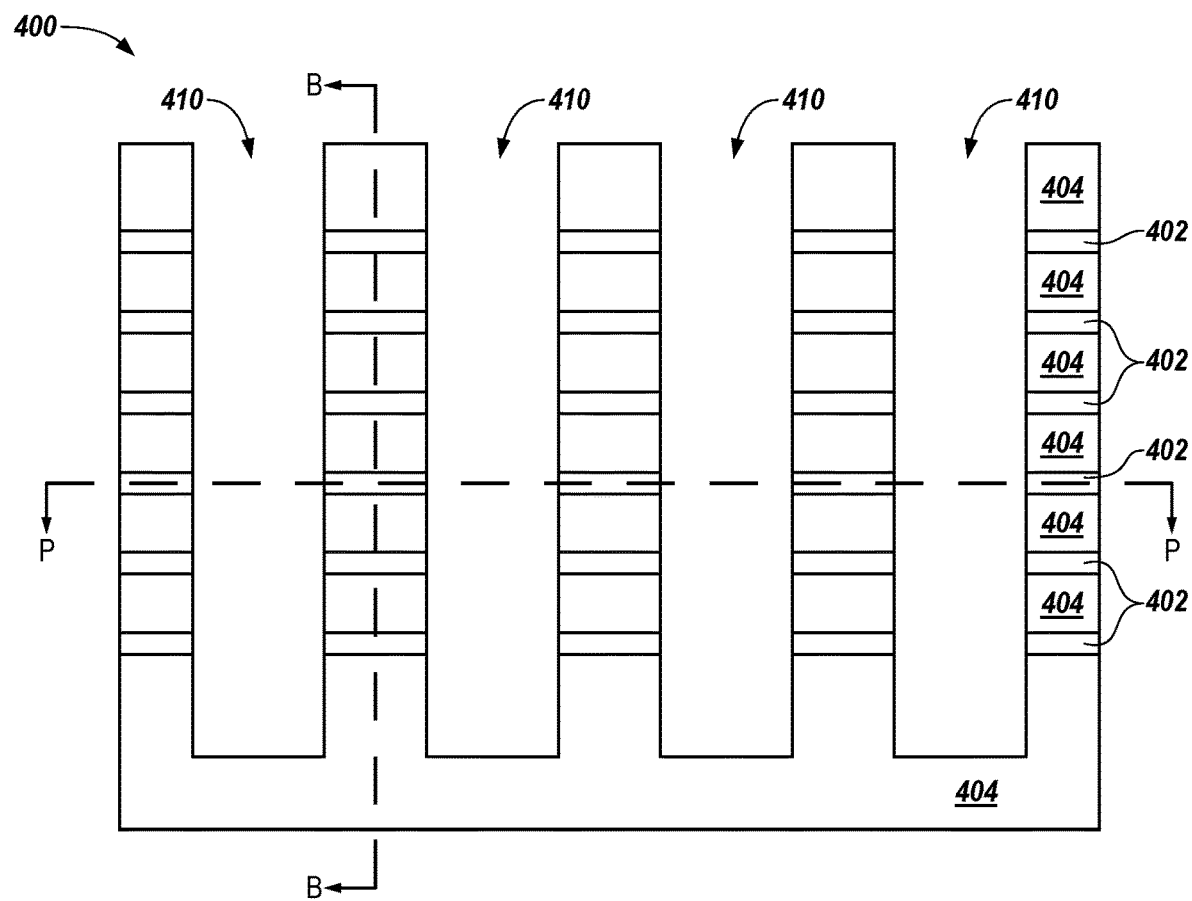
FIGS. 4A-4C illustrate various views of a subsequent processing step associated with forming the three dimensional memory array in accordance with an embodiment of the present disclosure.
Figure 4B:
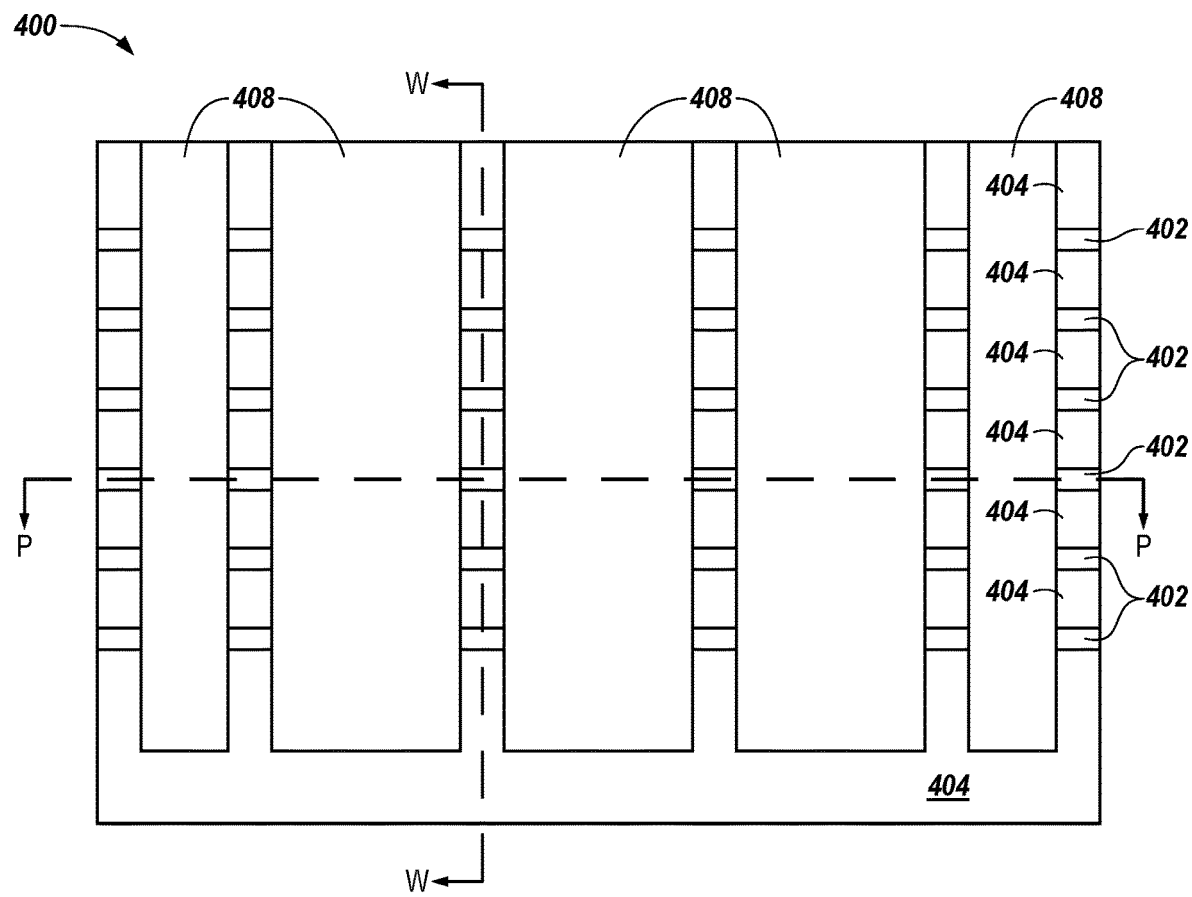
Figure 4C:
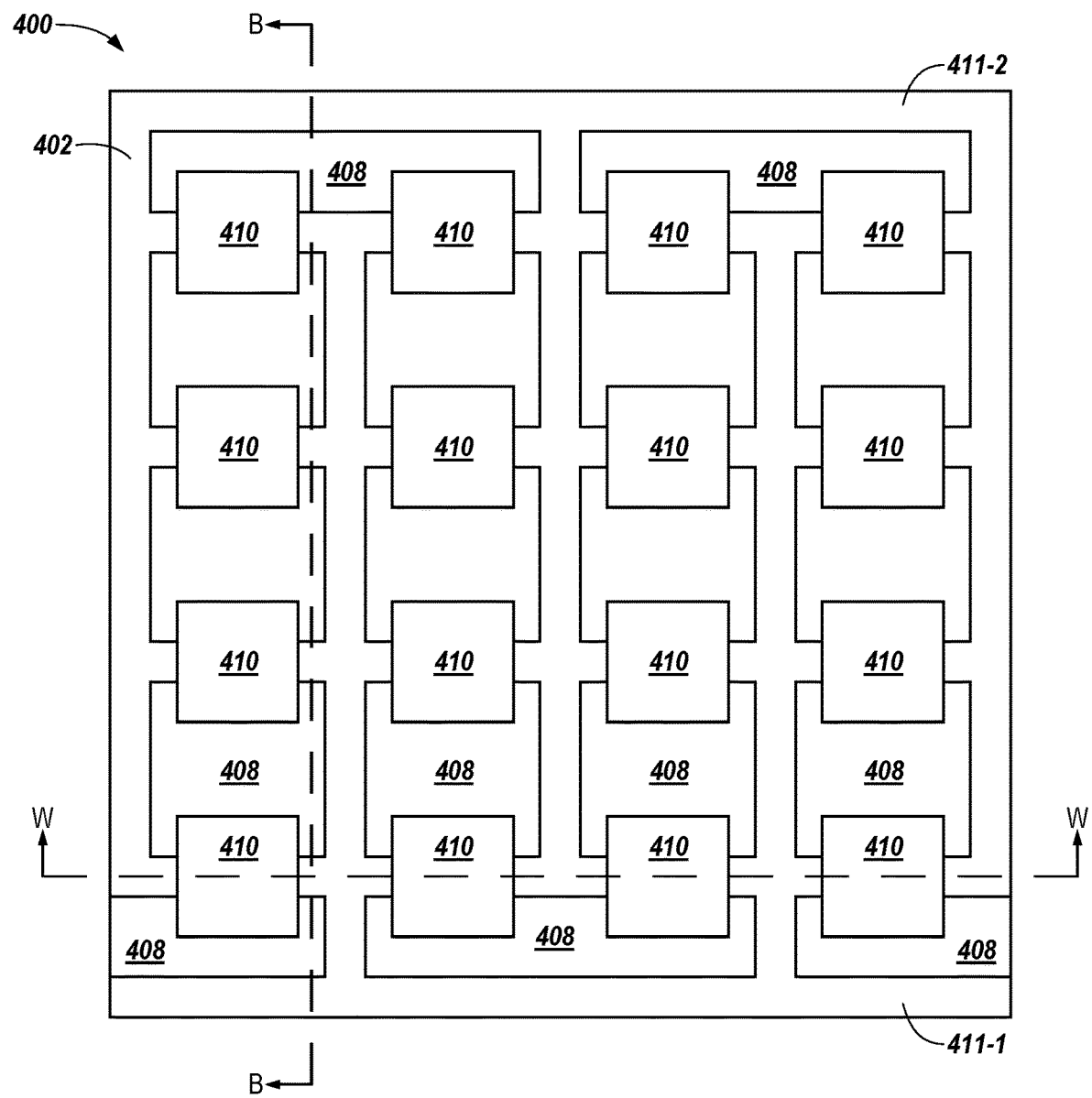

FIGS. 4A-4C illustrate various views of a subsequent processing step associated with forming the three dimensional memory array (referred to as 400 in FIGS. 4A-4C) in accordance with an embodiment of the present disclosure. For example, FIG. 4A illustrates a schematic cross-sectional view, along cut line W-W shown in FIGS. 4B and 4C, of the structure shown in FIGS. 3A-3C after the subsequent processing step. Further, FIG. 4B illustrates a schematic cross-sectional view, along cut line B-B shown in FIGS. 4A and 4C, of the structure shown in FIGS. 3A-3C after the subsequent processing step. Further, FIG. 4C illustrates a top view, along cut line P-P shown in FIGS. 4A and 4B, of the structure shown in FIGS. 3A-3C after the subsequent processing step.

As shown in FIGS. 4A-4C, a plurality of openings (e.g., vias or holes) 410 can be formed (e.g., etched and/or patterned) through the alternating insulation material 404 and conductive line material 402, and through insulation material 408. For example, the plurality of openings 410 can be formed through the conductive line material 402 and through insulation material 408 such that the two different sub-planes of each respective conductive line material 402 can be intercepted and cut so as to insulate them from each other, as illustrated in FIGS. 4A-4C.

By forming openings 410, portions of conductive line material 402 and insulation material 408 can be removed such that the resulting area of conductive line material 402 and insulation material 408 may exclude the area removed in forming openings 410. As such, forming openings 410 can divide each respective conductive line material 402 into a first (e.g., odd) sub-plane 411-1 and a second (e.g., even) sub-plane 411-2, as illustrated in FIGS. 4A-4C.

Each of the plurality of openings 410 can be formed at the same time. For instance, each of the plurality of openings 410 can be formed in a single etch and/or pattern using a single mask.

As shown in FIGS. 4A-4C, each of the plurality of openings 410 can be the same shape and size. For example, in the embodiment illustrated in FIGS. 4A-4C, each of the plurality of openings 410 can be square shaped. However, embodiments of the present disclosure are not limited to a particular shape(s) and/or size(s) for openings 410. For example, circular, oval, and/or rectangular shaped openings having a vertically or horizontally oriented main axis may be formed in some examples.

Further, although conductive line material 402 illustrated in FIGS. 4A-4C has a "T" or "+" shape between adjacent openings 410, embodiments of the present disclosure are not so limited. For example, conductive line material 402 may not have such a "T" or "+" shape, which may be achieved, for instance, if openings 410 have a dimension (e.g., diameter) that is the same or slightly larger than the spacing between adjacent conductive line materials 402, such that the formation of each opening 410 removes all portions of conductive line material 402 running in the W-W direction and openings 410 are tangent to portions of conductive line material 402 perpendicular to cut line W-W. In such an example, the memory cell dimension (e.g., contact area between conductive line material 402 and openings 410) can be controlled by the dimension of openings 410, while in the embodiment illustrated in FIGS. 4A-4C the memory cell dimension can be controlled by the formation of conductive line material 402.

Figure 5A:
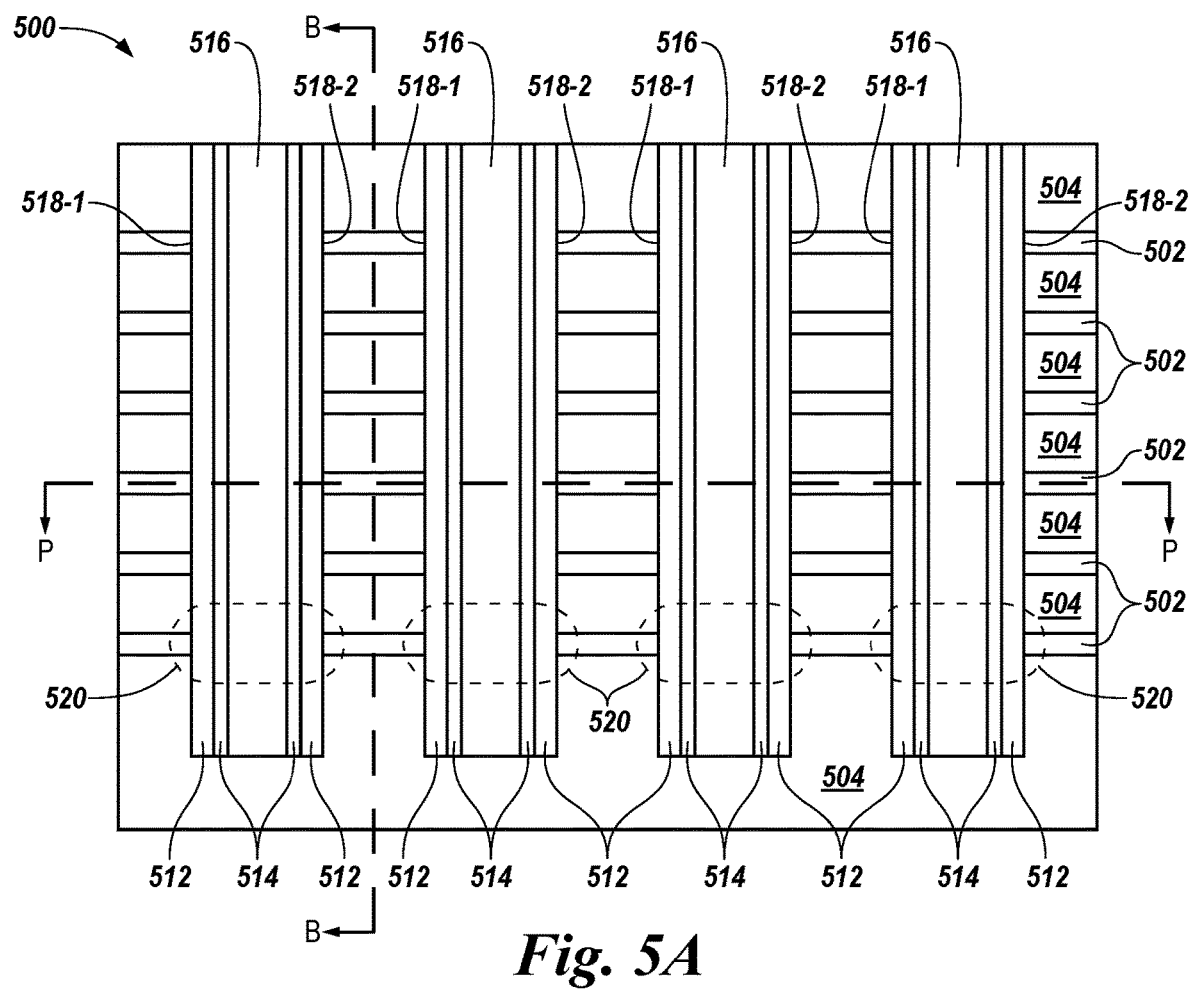
FIGS. 5A-5C illustrate various views of a subsequent processing step associated with forming the three dimensional memory array in accordance with an embodiment of the present disclosure.
Figure 5B:
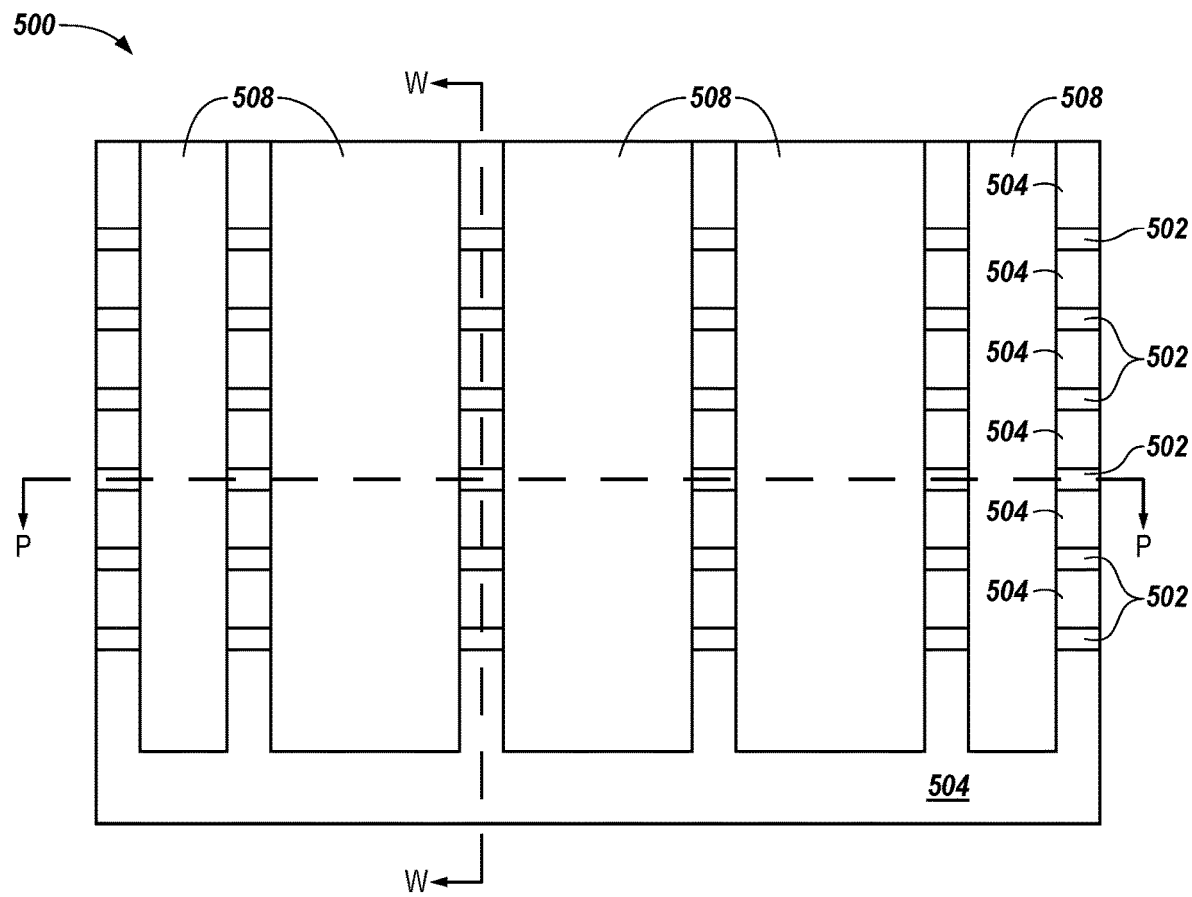
Figure 5C:
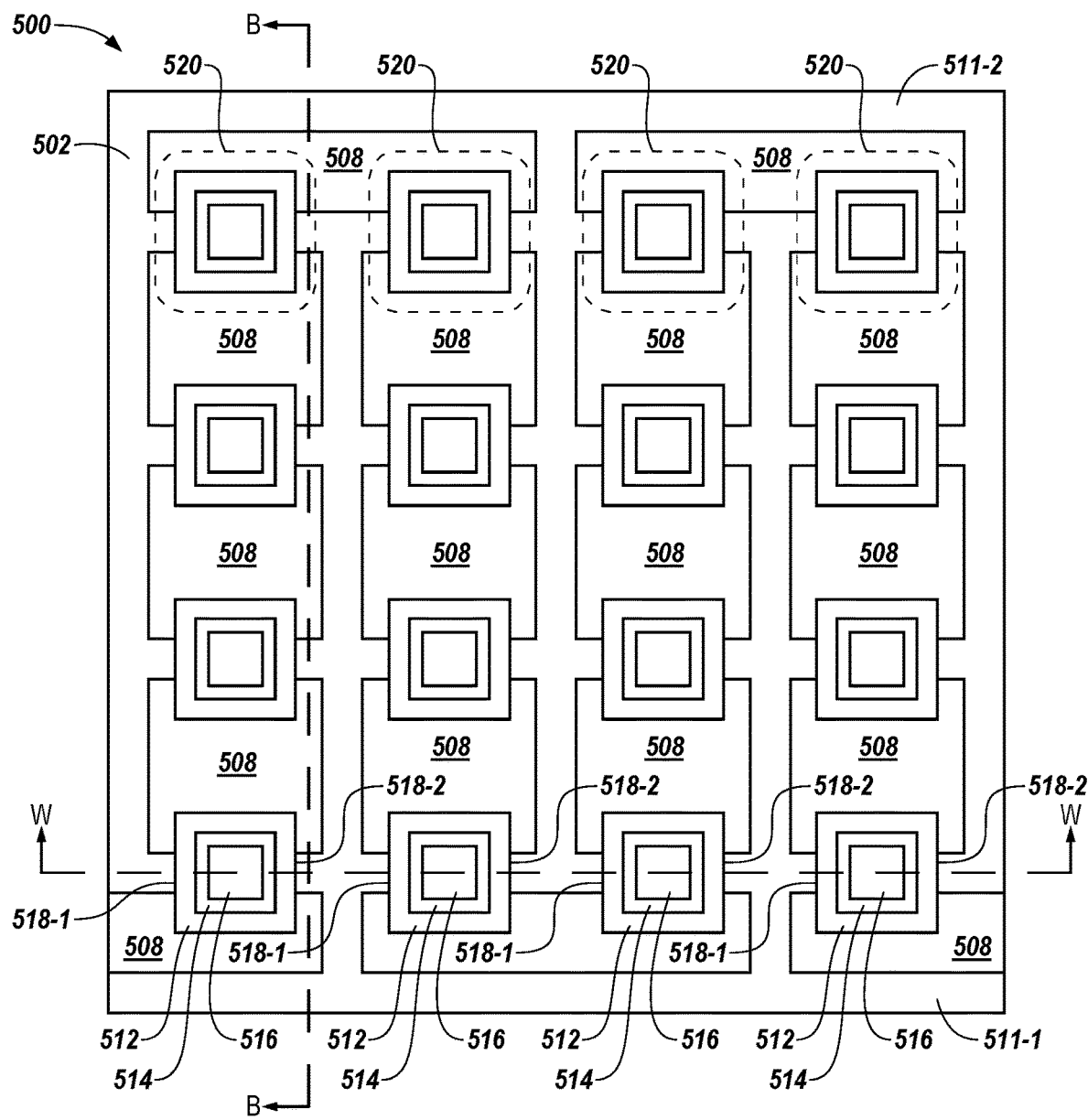

FIGS. 5A-5C illustrate various views of a subsequent processing step associated with forming the three dimensional memory array (referred to as 500 in FIGS. 5A-5C) in accordance with an embodiment of the present disclosure. For example, FIG. 5A illustrates a schematic cross-sectional view, along cut line W-W shown in FIGS. 5B and 5C, of the structure shown in FIGS. 4A-4C after the subsequent processing step. Further, FIG. 5B illustrates a schematic cross-sectional view, along cut line B-B shown in FIGS. 5A and 5C, of the structure shown in FIGS. 4A-4C after the subsequent processing step. Further, FIG. 5C illustrates a top view, along cut line P-P shown in FIGS. 5A and 5B, of the structure shown in FIGS. 4A-4C after the subsequent processing step.

As shown in FIGS. 5A-5C, each of the plurality of openings 410 can be filled by forming (e.g., depositing) a storage element material 512 in each respective opening 410, then forming a conductive cylinder (e.g., tube) 514 in each respective opening 410 in contact with (e.g., over) the storage element material 512 that was formed therein, and then forming a conductive extension 516 in each respective opening 410 in contact with (e.g., over) the conductive cylinder 514 that was formed therein, such that storage element material 512 is concentrically formed around conductive cylinder 514, which is concentrically formed around conductive extension 516. For instance, in the embodiment illustrated in FIGS. 5A-5C, the storage element material 512 and conductive cylinder 514 formed in each respective opening 410 are concentrically formed around their respective conductive extension 516 in a square shape. However, embodiments of the present disclosure are not limited to exact or quasi-exact square shapes. For instance, as used herein, "concentric" can refer to structures that are substantially surrounding each other in any shape, including circular, oval, or rectangular shapes, for instance.

Although not shown in FIGS. 5A-5C for clarity and so as not to obscure embodiments of the present disclosure, in some instances a portion of storage element material 512 and a portion of conductive cylinder 514 may also form on (e.g., cover) the bottom of each respective opening 410 when storage element material 512 and conductive cylinder 514 are deposited therein. Further, although not shown in FIGS. 5A-5C, addressable access lines may be present below array 500.

As shown in FIGS. 5A-5C, the storage element material 512, conductive cylinder 514, and conductive extension 516 formed in each respective opening 410 are arranged to extend substantially perpendicular to the conductive line material formed in the plurality of planes, which in connection with FIGS. 5A-5C can be referred to as conductive lines 502. For instance, the conductive line material formed in the plurality of planes can comprise conductive lines 502 after the processing step illustrated in FIGS. 5A-5C (e.g., after the formation and patterning of the conductive line material is complete). As such, the storage element material 512, conductive cylinder 514, and conductive extension 516 formed in each respective opening 410 can comprise a vertical stack of array 500. That is, array 500 can include a plurality of vertical stacks, wherein each respective stack includes a storage element material 512 and conductive cylinder 514 concentrically formed around a conductive extension 516, as illustrated in FIGS. 5A-5C. For instance, storage element material 512 can be formed between a conductive extension 516 and a first conductive line 502, and also between the conductive extension 516 and a second conductive line 502, wherein the second conductive line is coplanar with, but electrically decoupled from, the first conductive line 502. Conductive cylinder 514 may be present between either of storage element material 512 and conductive extension 516.

Figure 6:
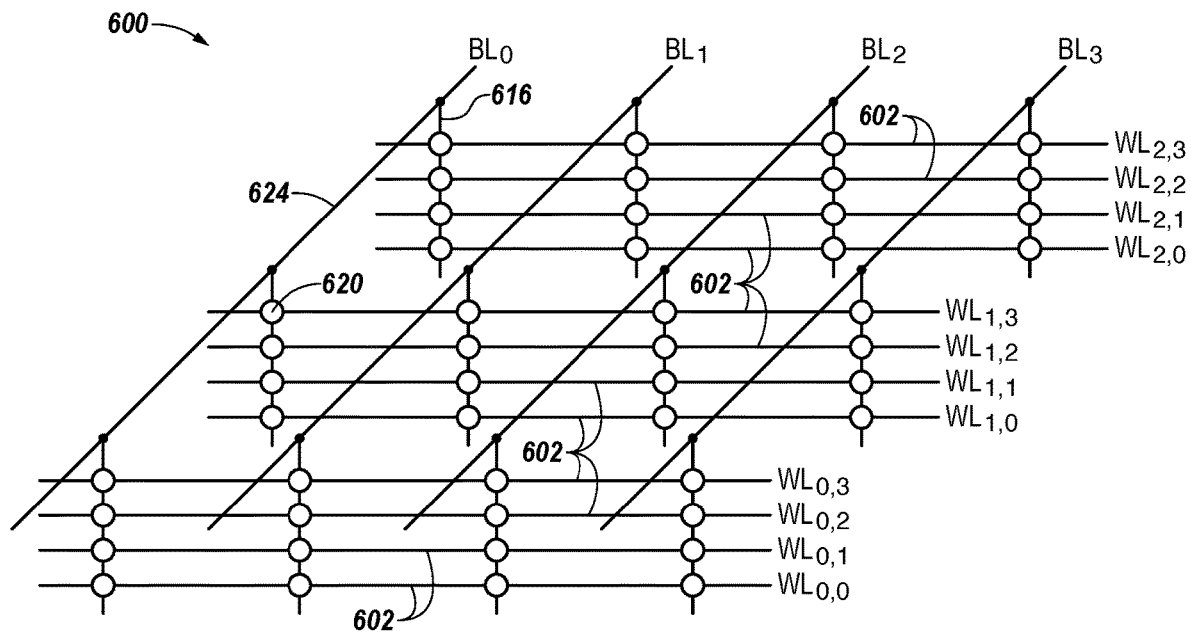
FIG. 6 illustrates a three dimensional memory array in accordance with an embodiment of the present disclosure.

Each respective conductive extension 516 can be a pillar communicatively coupled at one end to a different data (e.g., bit) line, as will be further described herein (e.g., in connection with FIG. 6). Each respective conductive extension 516 can comprise a metallic material, such as, for example, tungsten. For instance, each respective conductive extension 516 can comprise a different metallic material than the plurality of conductive lines 502.

The conductive cylinder 514 concentrically formed around each respective conductive extension 516 can be, for example, an electrode cylinder. The conductive cylinder 514 can comprise a metallic (or semi-metallic) material or a semiconductor material such as a doped polysilicon material, among others, which can be the same material as the plurality of conductive lines 502, for instance. However, other metallic, semi-metallic, or semiconductor materials can be used.

The storage element material 512 concentrically formed around each respective conductive cylinder 514 and conductive extension 516 can be a chalcogenide material, such as a chalcogenide alloy and/or glass, that can serve as a self-selecting storage element material (e.g., that can serve as both a select device and a storage element). For example, storage element material 512 (e.g., the chalcogenide material) can be responsive to an applied voltage, such as a program pulse, applied thereto. For an applied voltage that is less than a threshold voltage, storage element material 512 may remain in an "off" state (e.g., an electrically nonconductive state). Alternatively, responsive to an applied voltage that is greater than the threshold voltage, storage element material 512 may enter an "on" state (e.g., an electrically conductive state). Further, the threshold voltage of storage element material 512 in a given polarity may change based on the polarity (e.g., positive or negative) of the applied voltage. For instance, the threshold voltage may change based on whether the program pulse is positive or negative.

Examples of chalcogenide materials that can serve as storage element material 512 include indium(In)-antimony (Sb)-tellurium(Te) (IST) materials, such as $In_2Sb_2Te_5$, $In_1Sb_2Te_4$, $In_1Sb_4Te_7$, etc., and germanium(Ge)-antimony (Sb)-tellurium(Te) (GST) materials, such as $Ge_8Sb_5Te_8$, $Ge_2Sb_2Te_5$, $Ge_1Sb_2Te_4$, $Ge_1Sb_4Te_7$, $Ge_4Sb_4Te_7$, or etc., among other chalcogenide materials, including, for instance, alloys that do not change phase during the operation (e.g., selenium-based chalcogenide alloys). Further, the chalcogenide material may include minor concentrations of other dopant materials. The hyphenated chemical composition notation, as used herein, indicates the elements included in a particular mixture or compound, and is intended to represent all stoichiometries involving the indicated elements.

As shown in FIGS. 5A-5C, the storage element material 512 concentrically formed around conductive cylinder 514 and conductive extension 516 in each respective opening 410 (e.g., the storage element material 512 of each respective vertical stack of array 500) can have two different contacts (e.g., contacts 518-1 and 518-2) with each respective one of the plurality of conductive lines 502 at two different ends of that respective conductive line. For example, one of the contacts can be with the first (e.g., odd) sub-plane 511-1 of each respective conductive line 502, and the other contact can be with the second (e.g., even) sub-plane 511-2 of each respective conductive line 502. The contact area of the two different contacts 518-1 and 518-2 of each respective storage element material 512 with each respective conductive line 502 (e.g., the contact area between the storage element material 512 and each respective conductive line 502) can be based on (e.g., determined by multiplying) the thickness of that respective conductive line 502 and the width of the portion of that respective conductive line that was adjacent opening 410 (e.g., the width of the portion of that respective conductive line now in contact with that respective storage element material 512).

As shown in FIGS. 5A-5C, the two different contacts 518-1 and 518-2 of each respective storage element material 512 with each respective conductive line 502 can be separated from one another by insulation material 508. For instance, contact 518-1 can be on one side of storage element material 512, contact 518-2 can be on the opposite side of storage element material 512, and the remaining two sides of storage element material 512 (as well as a portion of the sides of storage element material 512 that include contacts 518-1 and 518-2) can be in contact with insulation material 508, as illustrated in FIGS. 5A-5C. As such, the two different contacts 518-1 and 518-2 of each respective storage element material 512 with each respective conductive line 502 can be non-continuous (e.g., separate) contacts that can be separately selectable and/or addressable, as will be further described herein.

Further, although not shown in FIGS. 5A-5C for clarity and so as not to obscure embodiments of the present disclosure, in some examples the two different contacts 518-1 and 518-2 can be formed along, or within the width of, the odd or even sub-plane of each respective conductive line 502. For instance, the two different contacts 518-1 and 518-2 can be formed in such a manner in embodiments in which conductive line 502 does not have a "T" or "+" shape between adjacent openings, as previously described herein (e.g., in connection with FIGS. 4A-4C).

In contrast, the storage element material of previous three dimensional memory arrays may have one continuous contact with each respective conductive line around the entire circumference of the storage element material. In such previous approaches, the contact area between the storage element material and each respective conductive line may be based on (e.g., determined by multiplying) the thickness of that respective conductive line and the entire outer circumference of the storage element material. This contact area may be three or more times greater than the contact area of contacts 518-1 and 518-2 illustrated in FIGS. 5A-5C.

As shown in FIGS. 5A-5C, at the location of array 500 where the conductive extension 516, conductive cylinder 514, and storage element material 512 of each respective vertical stack passes in proximity to a respective conductive line 502 (e.g., the location of contacts 518-1 and 518-2 with each respective conductive line 502), a concentric memory cell 520 can be formed that includes that portion of conductive extension 516, conductive cylinder 514, storage element material 512, and conductive line 502. Further, each respective cell 520 can comprise two separately (e.g., independently) addressable cells coupled to separate conductive lines. For instance, each respective plane of array 500 can include a concentric structure comprising two (e.g., semi-circular or semi-square) cells (e.g., an odd cell and an even cell) coupled to separate conductive lines on that plane.

As such, each respective vertical stack can include a plurality of memory cells 520, each respective memory cell 520 including a portion of a different one of the plurality of conductive lines 502 and a different portion of the conductive extension 516, conductive cylinder 514, and storage element material 512 of that stack, with the portion of storage element material 512 of each respective cell 520 being concentrically formed around the portion of conductive cylinder 514 and conductive extension 516 of that respective cell 520 and having contacts 518-1 and 518-2 with the portion of the conductive line 502 of that respective cell 520, as illustrated in FIGS. 5A-5C. For instance, the portion of the conductive line 502 of each respective memory cell 520 can include a portion of the first (e.g., odd) sub-plane 511-1 of that conductive line 502 and a portion of the second (e.g., even) sub-plane 511-2 of that conductive line 502, and the portion of the conductive extension 516, conductive cylinder 514, and storage element material 512 of each respective cell 520 can include the portion of the conductive extension 516, conductive cylinder 514, and storage element material 512 passing in proximity to that portion of conductive line 502. As such, concentric memory cells 520 can be formed substantially at the same levels as the word lines of array 500 are formed, such that a concentric memory cell is substantially co-planar with a conductive line 502.

As previously described herein, the contact area of contacts 518-1 and 518-2 (e.g., the contact area between storage element material 512 and conductive line 502) of each respective memory cell 520 can be reduced (e.g., three or more times smaller) than the contact area of the memory cells of previous three dimensional memory arrays. As such, the performance of three dimensional memory array 500 (e.g., the performance of a memory device that includes array 500) may be increased as compared with the performance of previous three dimensional memory arrays, as previously described herein.

Although not shown in FIGS. 5A-5C for clarity and so as not to obscure embodiments of the present disclosure, other materials may be formed before, after, and/or between storage element material 512, conductive cylinder 514, and/or conductive extension 516, for example to form adhesion layers or barriers against interdiffusion of materials and/or to mitigate composition mixing. Further, in some examples, array 500 may not include conductive cylinder 514 (e.g., conductive cylinder 514 may not be formed in each respective opening 410), such that conductive extension 516 may directly contact storage element material 512. Further, in the embodiment illustrated in FIGS. 5A-5C, any portion of storage element material 512, conductive cylinder 514, and conductive extension 516 that may have formed above the uppermost insulation material 504 has been removed, to isolate each respective conductive extension 516 (e.g., each respective pillar) from each other. This can be done by, for example, etching and/or chemical-mechanical polishing (CMP). Further, in some examples, conductive cylinder 514 may be optional (e.g., in such examples, no conductive cylinder may be formed between storage element material 512 and conductive extension 516).

FIG. 6 illustrates a three dimensional memory array 600 in accordance with an embodiment of the present disclosure. Array 600 can be, for example, array 500 previously described in connection with FIGS. 5A-5C. That is, array 600 can be processed according to the processing steps previously described herein (e.g., in connection with FIGS. 1A-1B, 2A-2C, 3A-3C, 4A-4C, and 5A-5C).

As shown in FIG. 6, access lines, which may be referred to as word lines (WLs), can be disposed on a plurality of levels (e.g., elevations, decks, planes). For example, word lines can be disposed on N levels. Insulation material (not shown in FIG. 6 for clarity and so as not to obscure embodiments of the present disclosure) can separate the levels of word lines. As such, the levels of word lines separated by insulation material can form a stack of WL/insulation materials. Further, as previously described herein, the word lines of each respective level can be divided into two sub-planes (e.g., an odd sub-plane and an even sub-plane), such that two (e.g., a pair) of word lines are created per level. However, embodiments of the present disclosure are not limited to two word lines per level.

Further, data lines, which may be referred to as bit lines (BLs), can be arranged substantially perpendicular to the word lines, and located at a level above the N levels of word lines (e.g., at the N+1 level). Each bit line can have a number of conductive extensions (e.g., vertical extensions) in proximity to the word lines, with a memory cell formed between the vertical extension and the word line.

For example, array 600 can include a plurality of conductive lines 602 (e.g., access lines), which may be referred to herein as word lines, and a plurality of conductive lines 624 (e.g., data lines), which may be referred to herein as bit lines. Word lines 602 can be arranged into a number of levels. Word lines 602 are shown being arranged into four levels in FIG. 6. However, the quantity of levels into which the word lines 602 can be arranged are not limited to this quantity, and word line 602 can be arranged into more, or fewer, levels. Word lines 602 are arranged substantially parallel one another within a particular level. The word lines 602 can be aligned vertically in a stack. For instance, word lines 602 in each of the multiple levels can be located at a same relative location within each level so as to be aligned with word lines 602 directly above and/or below. Insulation material (e.g., insulation material 504 previously described in connection with FIGS. 5A-5C; not shown in FIG. 6) can be located between the levels at which word lines 602 are formed and between word lines 602 at a particular level.

As shown in FIG. 6, bit lines 624 can be arranged substantially parallel one another at a level different than the levels at which word lines 602 are located (e.g., above the levels at which word lines 602 are located). For instance, the bit lines can be located at the top of the memory array 600, as illustrated in FIG. 6. As an additional example, the bit lines can be located at the bottom of array 600 (e.g., such that conductive extensions 516 contact the bit lines at the bottom of openings 410). The bit lines 624 can be further arranged substantially perpendicular (e.g., orthogonal) to word lines 602 so as to have overlappings (e.g., crossings at different levels) therebetween. However, embodiments of the present disclosure are not limited to a strictly parallel/orthogonal configuration.

The indices shown for each word line 602 in FIG. 6 indicate the position (e.g., ordering) of the word lines within a particular level and the level. For example, word line $WL_{2,0}$ is shown being located at position 2 within level 0 (a word line at the bottom of a stack of word lines located at position 2), and word line $WL_{2,3}$ is shown being located at position 2 within level 3 (a word line at the top of a stack of word lines located at position 2). The quantity of levels into which the word lines 602 can be arranged, and the quantity of word lines 602 at each level can be more, or fewer, than the quantities shown in FIG. 6.

At each overlapping of a bit line 624 and a stack of word lines 602, a conductive extension 616 of the bit line 624 is oriented substantially perpendicular to the bit line 624 and the word lines 602, so as to intersect a portion of each word line 602 in the stack of word lines. For example, the conductive extension 616 of the bit line 624 can be arranged to extend vertically from the bit line 624 to intersect a portion the respective word lines 602 therebelow, as shown in FIG. 6. For instance, as one example, the conductive extension 616 can pass through a word line 602, so as to be surrounded entirely by the word line 602. According to an embodiment, the conductive extension 616 can pass near the word line 602 (e.g., adjacent), such that a memory cell 620 can be formed, as previously described herein (e.g., in connection with FIGS. 5A-5C). For example, FIG. 6 depicts one cell 620 at a crossing of conductive extension 616 and word line 602, although in some examples conductive extension 616 may be coupled to a pair of word lines (e.g., one even and one odd), as previously described herein.

Memory cells 620 are shown in FIG. 6 arranged in a three dimensional architecture near the location of where the conductive extension 616 of a bit line 624 and the word lines 602 are in proximity to one another at different levels. For example, a memory cell 620 can be located where a conductive extension 616 passes through a portion of a word line 602, as previously described herein (e.g., in connection with FIGS. 5A-5C).

As such, the memory cells 620 can be arranged in multiple levels, each level having memory cells at intersections of conductive extensions and word lines. The levels of memory cells 620 can be formed at different levels from one another, thereby being vertically stacked. Accordingly, memory array 600 can be a three dimensional memory array that includes include memory cells 620 having a common bit line 624, but separate word lines 602. For instance, each respective memory cell 620 can be substantially co-planar to its respective word line 602. Although four levels of word lines 602 (and four corresponding levels of memory cells 620) are shown in FIG. 6, embodiments of the present disclosure are not so limited and can include more, or fewer, levels of word lines 602 (and corresponding levels of memory cells 620). Memory cells may be formed substantially at the same levels as word lines are formed.

Further, the memory cells 620 of memory array 600 can be coupled to decoder circuitry (not shown in FIG. 6). The decoder circuitry can be used to select a particular memory cell 620 during a program or sense operation, as will be further described herein (e.g., in connection with FIG. 7).

Figure 7:
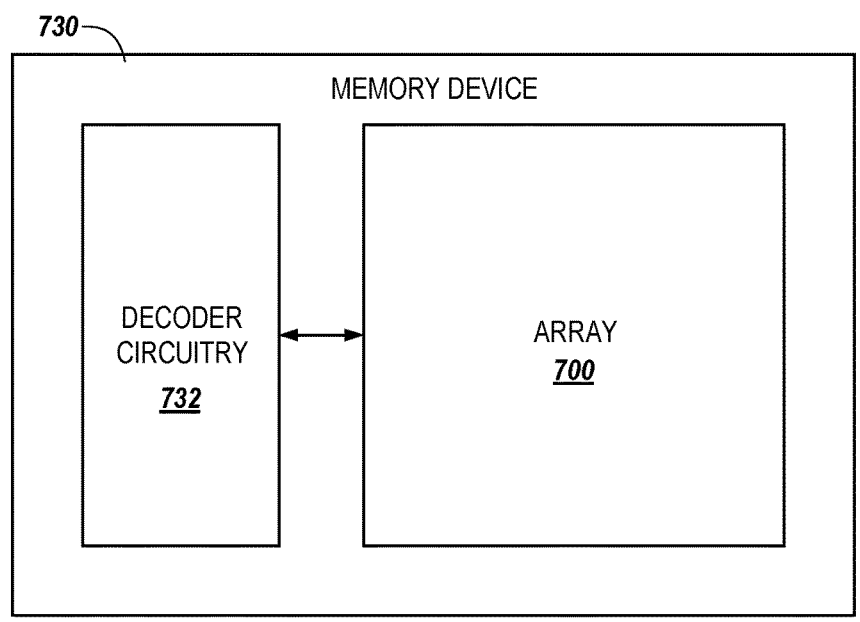
FIG. 7 is a block diagram of an apparatus in the form of a memory device in accordance with an embodiment of the present disclosure.

FIG. 7 is a block diagram of an apparatus in the form of a memory device 730 in accordance with an embodiment of the present disclosure. As used herein, an "apparatus" can refer to, but is not limited to, any of a variety of structures or combinations of structures, such as a circuit or circuitry, a die or dies, a module or modules, a device or devices, or a system or systems, for example.

As shown in FIG. 7, memory device 730 can include a memory array 700. Memory array 700 can be, for example, three dimensional memory array 500 and/or 600 previously described in connection with FIGS. 5A-5C and 6, respectively. Although a single memory array 700 is shown in FIG. 7 for clarity and so as not to obscure embodiments of the present disclosure, memory device 730 may include any number of memory arrays analogous to array 700.

As shown in FIG. 7, memory device 730 can include decoder circuitry 732 coupled to array 700. As used herein, decoder circuitry 732 can include and/or refer to row decoder and/or column decoder circuitry. Decoder circuitry 732 can be included on the same physical device (e.g., the same die) as array 700, or can be included on a separate physical device that is communicatively coupled to the physical device that includes array 700.

Decoder circuitry 732 can receive and decode address signals to access the memory cells of memory array 700 during program and/or sense operations performed on array 700. For example, decoder circuitry 732 can include portions of circuitry for use in selecting a particular memory cell of array 700 to access during a program or sense operation. For instance, a first portion of decoder circuitry 732 may be used to select the conductive extension of the memory cell, a second portion of decoder circuitry 732 may be used to select one of the two different contacts (e.g., 518-1 and 518-2) between the storage element material and word line of the cell, and a third portion of decoder circuitry 732 may be used to select the other one of the two contacts between the storage element material and word line of the cell. The conductive extension of the memory cell can be selected for example, using a selector, such as, for instance, a vertical transistor, on the pillar of the conductive extension that is driven by lines running essentially orthogonal to the bit lines. The two different contacts between the storage element material and word line of the cell can be selected by, for instance, selecting the two different sub-planes of the word line of the cell (e.g., one of the contacts can be selected by selecting the even sub-plane of the word line, and the other contact can be selected by selecting the odd sub-plane of the word line).

In an embodiment, decoder circuitry 732 (e.g., the second and third portions of decoder circuitry 732) can be used to separately select the two different contacts between the storage element material and word line of the cell being accessed during the program or sense operation. For example, decoder circuitry 732 can be used to apply an access voltage (e.g., a program or read voltage) to one of the two different contacts (e.g., through the corresponding word line) to select that contact, and an inhibit voltage to the other contact to deselect that contact while the voltage is applied to the first contact. The inhibit voltage can be a voltage, such as, for instance, a ground voltage, that reduces the overall voltage drop across the storage element material of the cell. Further, while the voltage is being applied to the first contact, decoder circuitry 732 (e.g., the first portion of decoder circuitry 732) can be used to apply a voltage to the conductive extension of the memory cell. The voltage applied to the conductive extension of the memory cell can have the same magnitude and opposite polarity as the access voltage applied to the first contact, and the inhibit voltage can have a magnitude between the access voltage and the voltage applied to the conductive extension.

For instance, during a program operation to program a memory cell with a particular voltage (e.g., Vp), a voltage of Vp/2 may be applied to its conductive extension and a voltage of −Vp/2 may be applied to one of its two contacts, while its other contact is grounded. As an additional example, to program the cell with a voltage of −Vp, a voltage of −Vp/2 may be applied to its conductive extension and a voltage of Vp/2 may be applied to one of its two contacts, while its other contact is grounded. As an additional example, during a sense operation performed with a particular voltage (e.g., Vr), a voltage of Vr/2 may be applied to the conductive extension of the cell, a voltage of −Vr/2 may be applied to one of the two contacts of the cell, and the other contact may be grounded. Further, in another example, the voltages applied to conductive extension and/or the contact(s) may vary with time.

In an embodiment, decoder circuitry 732 (e.g., the second and third portions of decoder circuitry 732) can be used to concurrently select the two different contacts between the storage element material and word line of the cell being accessed during the program or sense operation. For example, decoder circuitry 732 can be used to bias the two different contacts together at the same time. In such an embodiment, the amount of circuitry needed for decoder circuitry 732 may be less than the amount needed for the embodiment in which the contacts are being selected separately.

The embodiment illustrated in FIG. 7 can include additional circuitry, logic, and/or components not illustrated so as not to obscure embodiments of the present disclosure. For example, memory device 730 can include a controller to send commands to perform operations on memory array 700, such as operations to sense (e.g., read), program (e.g., write), move, and/or erase data, among other operations. Further, memory device 730 can include address circuitry to latch address signals provided over I/O connectors through I/O circuitry. Further, memory device 730 can include a main memory, such as, for instance, a DRAM or SDRAM, that is separate from and/or in addition to memory array(s) 700.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A three dimensional memory array, comprising:
   a plurality of conductive lines separated from one other by an insulation material;
   a plurality of conductive extensions arranged to extend substantially perpendicular to the plurality of conductive lines;
   a storage element material formed around each respective one of the plurality of conductive extensions and having two different contacts with each respective one of the plurality of conductive lines at different ends of that respective conductive line; and
   circuitry configured to separately select the two different contacts with each respective one of the plurality of conductive lines.

2. The three dimensional memory array of claim 1, wherein the circuitry is configured to separately select the two different contacts with each respective one of the plurality of conductive lines during a program operation performed on the array.

3. The three dimensional memory array of claim 1, wherein the circuitry is configured to separately select the two different contacts with each respective one of the plurality of conductive lines during a sense operation performed on the array.

4. The three dimensional memory array of claim 1, wherein:
   each respective one of the plurality of conductive lines is divided into a first sub-plane and a second sub-plane; and
   wherein one of the contacts with each respective conductive line is with the first sub-plane of that respective conductive line, and the other one of the contacts with each respective conductive line is with the second sub-plane of that respective conductive line.

5. The three dimensional memory array of claim 1, wherein the circuitry comprises decoder circuitry.

6. A three dimensional memory array, comprising:
   a plurality of conductive lines separated from one other by an insulation material;
   a plurality of conductive extensions arranged to extend substantially perpendicular to the plurality of conductive lines;
   a storage element material formed around each respective one of the plurality of conductive extensions; and
   a plurality of memory cells, wherein:
   each respective memory cell includes:
      a portion of one of the plurality of conductive lines;
      a portion of one of the plurality of conductive extensions; and
      a portion of the storage element material, wherein the portion of the storage element material of each respective memory cell is formed around the portion of the conductive extension of that respective memory cell and has two different contacts with the portion of the conductive line of that respective memory cell at different ends of that respective conductive line; and
   each respective memory cell comprises two separately addressable memory cells coupled to separate conductive lines.

7. The three dimensional memory array of claim 6, wherein:
   the three dimensional memory array comprises a plurality of planes; and
   each respective plane includes a concentric structure comprising two separately addressable memory cells coupled to separate conductive lines on that plane.

8. The three dimensional memory array of claim 6, wherein the two separately addressable memory cells of each respective memory cell are semi-circular shaped memory cells.

9. The three dimensional memory array of claim 6, wherein the two separately addressable memory cells of each respective memory cell are semi-square shaped memory cells.

10. The three dimensional memory array of claim 6, wherein:

one of the two separately addressable memory cells of each respective memory cell is an odd memory cell; and the other one of the two separately addressable memory cells of each respective memory cell is an even memory cell.

11. A method of operating a three dimensional memory array, comprising:

applying a first voltage to one of two different contacts a storage element material of the three dimensional memory array that is formed around a conductive extension of the three dimensional memory array has with one of a plurality of conductive lines of the three dimensional memory array; and applying a second voltage to the other one of the two different contacts the storage element material has with the one of the plurality of conductive lines while the first voltage is applied to the one of the two different contacts.

12. The method of claim 11, wherein the method includes applying a third voltage to the conductive extension around which the storage element material is formed while the first voltage is applied to the one of the two different contacts.

13. The method of claim 12, wherein the third voltage has a same magnitude and opposite polarity as the first voltage.

14. The method of claim 12, wherein the third voltage is a ground voltage.

15. The method of claim 11, wherein the first voltage is a program voltage.

16. The method of claim 11, wherein the first voltage is a sense voltage.

17. The method of claim 11, wherein the method includes varying the first voltage and the second voltage over time.

* * * * *